United States Patent
Chan et al.

(10) Patent No.: US 6,988,207 B2
(45) Date of Patent: Jan. 17, 2006

(54) SCAN INSERTION TESTING OF ASICS

(75) Inventors: Yiu Lam Chan, Raleigh, NC (US);
Michael R. Sollins, Raleigh, NC (US);
Ronald R. Munoz, Raleigh, NC (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 1035 days.

(21) Appl. No.: 09/882,960

(22) Filed: Jun. 15, 2001

(65) Prior Publication Data

US 2002/0194561 A1 Dec. 19, 2002

(51) Int. Cl.
*G06F 9/00* (2006.01)
*G06F 3/00* (2006.01)
*H04B 3/46* (2006.01)

(52) U.S. Cl. ............................ 713/200; 710/5; 375/224
(58) Field of Classification Search ................ 713/200, 713/201; 375/224; 710/5, 19
See application file for complete search history.

(56) References Cited

U.S. PATENT DOCUMENTS

| | | | | |
|---|---|---|---|---|
| 3,986,046 A | * | 10/1976 | Wunner | 327/258 |
| 5,227,672 A | * | 7/1993 | Sawtell | 327/141 |
| 5,329,529 A | * | 7/1994 | Murphy et al. | 370/538 |
| 5,982,815 A | * | 11/1999 | Ramirez | 375/224 |
| 6,208,621 B1 | * | 3/2001 | Ducaroir et al. | 370/241 |
| 6,804,725 B1 | * | 10/2004 | Whetsel | 710/5 |

OTHER PUBLICATIONS

Technical Publication, "Designs with Multiple Clock Domains: Avoiding Clock Skew and Reducing Pattern Count Using DFTAdvisor™ and FastScan™", Mentor Graphics Corporation, Mar., 2001.

* cited by examiner

*Primary Examiner*—Norman M. Wright
(74) *Attorney, Agent, or Firm*—Fogg and Associates, LLC; Laura A. Ryan

(57) ABSTRACT

A circuit that uses a bi-directional buffer as follows: First a tri-state output buffer is connected to a functional clock and a bi-directional port is connected to a test clock. The bi-directional buffer is configured to receive control signals to selectively block and unblock the tri-state output port connected to the functional clock. In addition, the bi-directional port connected to a test clock is connected to the internal logic of the device. When the tri-state output buffer connected to the functional clock is blocked, the test clock transmits a clock signal to the internal logic of the device. When the tri-state output buffer connected to the functional clock is unblocked, the functional clock transmits a clock signal to the internal logic of the device.

41 Claims, 3 Drawing Sheets

SCAN INSERTION TESTING OF ASICS

TECHNICAL FIELD

The present invention relates generally to application specific integrated circuits (ASICs) and, in particular, to scan insertion testing in ASICs.

BACKGROUND

Application Specific Integrated Circuits (ASICs) often have an internally generated clock, such as divide-down clock 102 shown in FIG. 1, that activates the internal logic of the ASIC. Internally generated clocks are generated from an external functional clock, e.g., functional clock 104. Frequently, the frequency of the functional clock is reduced using a frequency divider, e.g., frequency divider 106, which divides the frequency by x, where x is a numerical value greater than one. The division is performed to accommodate specific internal clock requirements.

In many instances, ASICs are tested for faults, such as stuck-at faults, e.g., stuck flip-flops. Flip-flops generate a stable one or zero signal depending on inputs. If flip-flops are stuck, problems occur with signal generation. Although there are multiple methods for design for testability (DFT), one of the most popular methods to test for stuck-at faults is scan insertion. Basically, flip-flops in the ASIC are replaced with scan flip-flops. These scan flip-flops have a multiplexer in front of the flip-flop that allows a selection between normal functional data or specially generated test patterns. The selector to the multiplexer is a scan enable signal that determines which data goes to the input of the flip-flop.

One problem when inserting scan flip-flops is how to control the clocks that drive the flip-flops. A popular method is to add a multiplexer, e.g., multiplexer 108, to the ASIC clock circuitry. An input pin of a multiplexer 108 is connected to an output of frequency divider 106, and another input pin of multiplexer 108 is connected to a test clock, e.g., test clock 110 shown in FIG. 1. A scan-insertion test signal, e.g., scan-tester 110, is connected to a select pin of multiplexer 108. Scan-tester 112 switches the ASIC between a functional mode and a test mode, selecting the functional clock for normal operation and the test clock for a testing operation. In functional mode, divide-down clock 102 (whose source is the output of frequency divider 106) drives the internal logic of the ASIC. In test mode, test clock 112 is now connected to divide-down clock 102 to drive the internal logic of the ASIC to test the operation of the ASIC.

Another problem associated with existing scan insertion ASIC testing is that the internally generated divide-down clock can be skewed relative to the functional clock, because the clocks are independent. Skewing is compounded between the functional clock and the internally generated divide-down clock because of the multiplexer added to control the scan flip-flops. The effect of the skew often causes timing issues that can lead to set-up and hold violations during testing.

For the reasons stated above, and for other reasons stated below which will become apparent to those skilled in the art upon reading and understanding the present specification, there is a need in the art for eliminating the skew between the functional clock and the internally generated divide-down clock used in existing scan insertion ASIC testing.

SUMMARY

The above-mentioned problems with skewing between a functional clock and internally generated divide-down clocks used in existing scan insertion ASIC testing and other problems are addressed by embodiments of the present invention and will be understood by reading and studying the following specification. Some embodiments of the present invention eliminate skewing between the functional clock and internally generated divide-down clocks used in existing scan insertion ASIC testing by providing a circuit and method that eliminates the use of internally generated divide-down clocks during scan testing.

More particularly, in one embodiment, the circuit has an input port connected to a functional clock and the input of a tri-state output port that is controlled by a tester signal. The tri-state output port connected to the tester signal is configured to receive that tester control signal to selectively block and unblock the input connected to the functional clock. In addition, this tri-state output port is part of a bi-directional buffer that is connected to a second clock. The input port of the bi-directional buffer has an output that drives the internal logic of the ASIC. When the tri-state output port connected to the functional clock is blocked (tri-stated), the second clock (e.g. a test clock) can now drive the internal logic of the ASIC via the input port of the bi-directional buffer. When the tri-state output port connected to the functional clock is unblocked (not tri-stated), the functional clock transmits a clock signal to the internal logic of the ASIC via the input port of the bi-directional buffer. In this mode the functional clock can also be used to drive logic external to the ASIC if needed.

Another embodiment provides a test method that includes receiving a control signal at a circuit and selectively blocking a first clock signal received at the circuit based on the control signal. The method includes receiving a second clock signal at a bi-directional port of the circuit and transmitting the second clock signal when the first clock signal is blocked. Moreover, the method includes transmitting the first clock signal when the first clock signal is not blocked.

Other embodiments are described and claimed.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention eliminate skewing between a functional clock and internally generated divide-down clocks used in existing scan insertion ASIC testing by providing a circuit and method that eliminates the use of internally generated divide-down clocks during scan testing.

Embodiments of the present invention replace internally generated divide-down clocks with externally controlled clocks that are connected to a bi-directional port.

Figure 2:
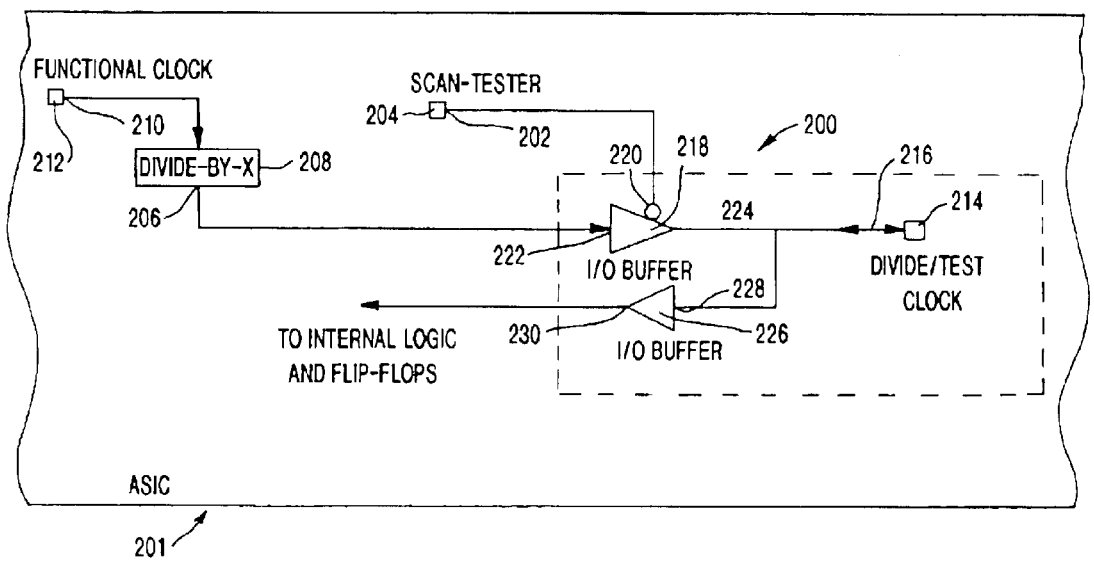
FIG. 2 is a circuit diagram according to the teachings of one embodiment of the present invention.

FIG. 2 illustrates a circuit 200, according to one embodiment of the present invention. Circuit 200, in one embodiment, is a part of ASIC 201. Circuit 200 receives a control signal from a scan-tester, e.g., scan-tester 204, and a clock signal from output port 206 of frequency divider 208. Circuit 200 outputs a signal to internal logic devices and flip-flops of an ASIC, for example, ASIC 201, where, in one embodiment, scan-tester 204 and frequency divider 208 are part of ASIC 201. Frequency divider 208 is connected to an output 210 of functional clock 212 and divides a clock signal generated by functional clock 212 by x, where x, in one embodiment, is a number greater than one. Divide down by frequency divider 208 is performed to supply a suitable clock frequency to circuit 200. In one embodiment, functional clock 212 is a part of ASIC 201.

In another embodiment, a circuit 200 is provided that receives a control signal from output port 202 of scan-tester 204, a clock signal from output port 206 of frequency divider 208, and a clock signal from divide/test clock 214 via bi-directional port 216. In this embodiment, the circuit 200 outputs a signal to the internal logic devices and flip-flops of ASIC 201. The signal from divide/test clock 214 tests the ASIC for faults. In one embodiment, divide/test clock 214 is a part of ASIC 201.

Circuit 200 includes tri-state output buffer 218 having inputs 220 and 222 respectively connected to output 202 of scan-tester 204 and output 206 of frequency divider 208. Circuit 200 includes divide/test clock 214. Divide/test clock 214 is connected to output 224 of tri-state output buffer 218 via a bi-directional port 216. Circuit 200 further includes input buffer 226 having an input 228 and an output 230. Output 230 of input buffer 226 is connected to the internal logic and flip-flops of an ASIC, e.g., ASIC 201. Input 228 of input buffer 226 is connected to output 224 of tri-state output buffer 218 and to bi-directional port 216.

Figure 1:
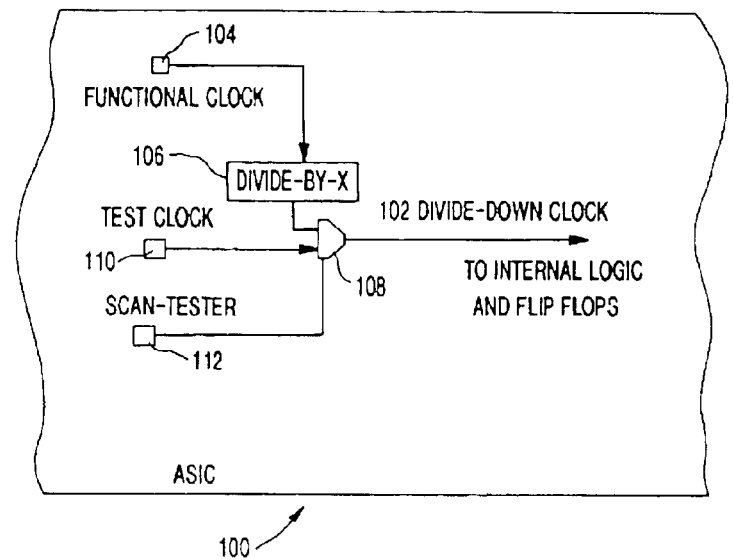
FIG. 1 is a diagram of a prior art circuit.

In operation, circuit 200 is selectively switched between a functional mode and a test mode by a scan-test signal, or control signal, from scan-tester 204. In the functional mode, the control signal is low, or inactive. Circuit 200 receives a divided-clock signal from frequency divider 208. When the control signal is low, the divided-clock signal flows through tri-state output buffer 218 and directly into input buffer 226. The divided-clock signal then flows from input buffer 226 to the internal logic and flip-flops of ASIC 201. This enables functional clock 212 to activate and operate the internal logic of the ASIC directly, eliminating the need for the multiplexer 108 of FIG. 1. In one embodiment, the divided clock can be sent off chip to drive external logic, if needed.

A test mode is initiated when the tri-state output buffer 218 receives a high, or active, control signal from scan-tester 204. The active control signal instructs the tri-state output buffer 218 to block the divided-clock signal from frequency divider 208. Meanwhile, the divide/test clock 214 sends a clock signal to the internal logic and flip-flops of ASIC 201 via bi-directional port 216 and input buffer 226 to test the ASIC for faults, e.g., stuck flip-flops. This eliminates the clock skewing associated with using test clocks multiplexed in conjunction with internally generated clocks, such as test clock 110 and functional clock 104 of FIG. 1.

Figure 3:
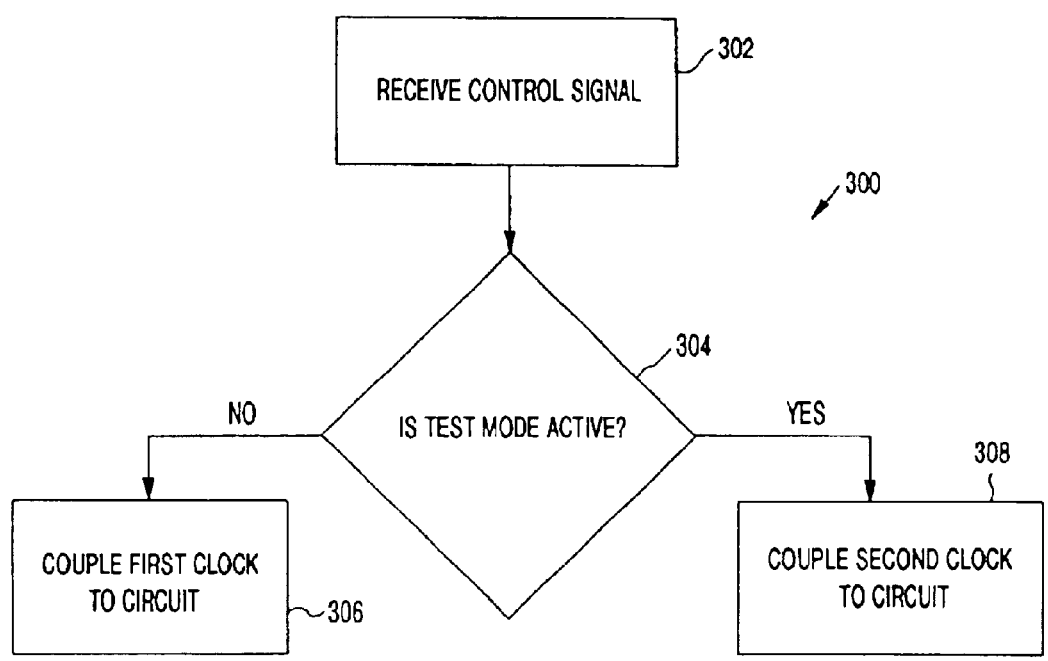
FIG. 3 is a flow chart diagram of a method according to another embodiment of the present invention.

FIG. 3 is a flow chart of an embodiment of a test method 300 according to the teachings of the present invention. Test method 300 includes receiving a control signal indicative of an active or inactive test mode of a circuit at block 302. In one embodiment, the control signal is received at a circuit, such as circuit 200, from a scan-tester, such as scan-tester 204. The control signal is evaluated at decision block 304. If the test mode is inactive, a first external clock is connected through the circuit through a buffer at block 306. In one embodiment, this includes coupling a functional clock, such as functional clock 210, and a frequency divider, such as frequency divider 208, through a circuit through an output buffer. If the test mode is active, a second external clock is connected through the circuit through a bi-directional port and an input buffer at block 308. In one embodiment, this includes coupling a divide/test clock, such as divide/test clock 214, through a circuit, such as circuit 200, through a bi-directional port and an input buffer.

Figure 4:
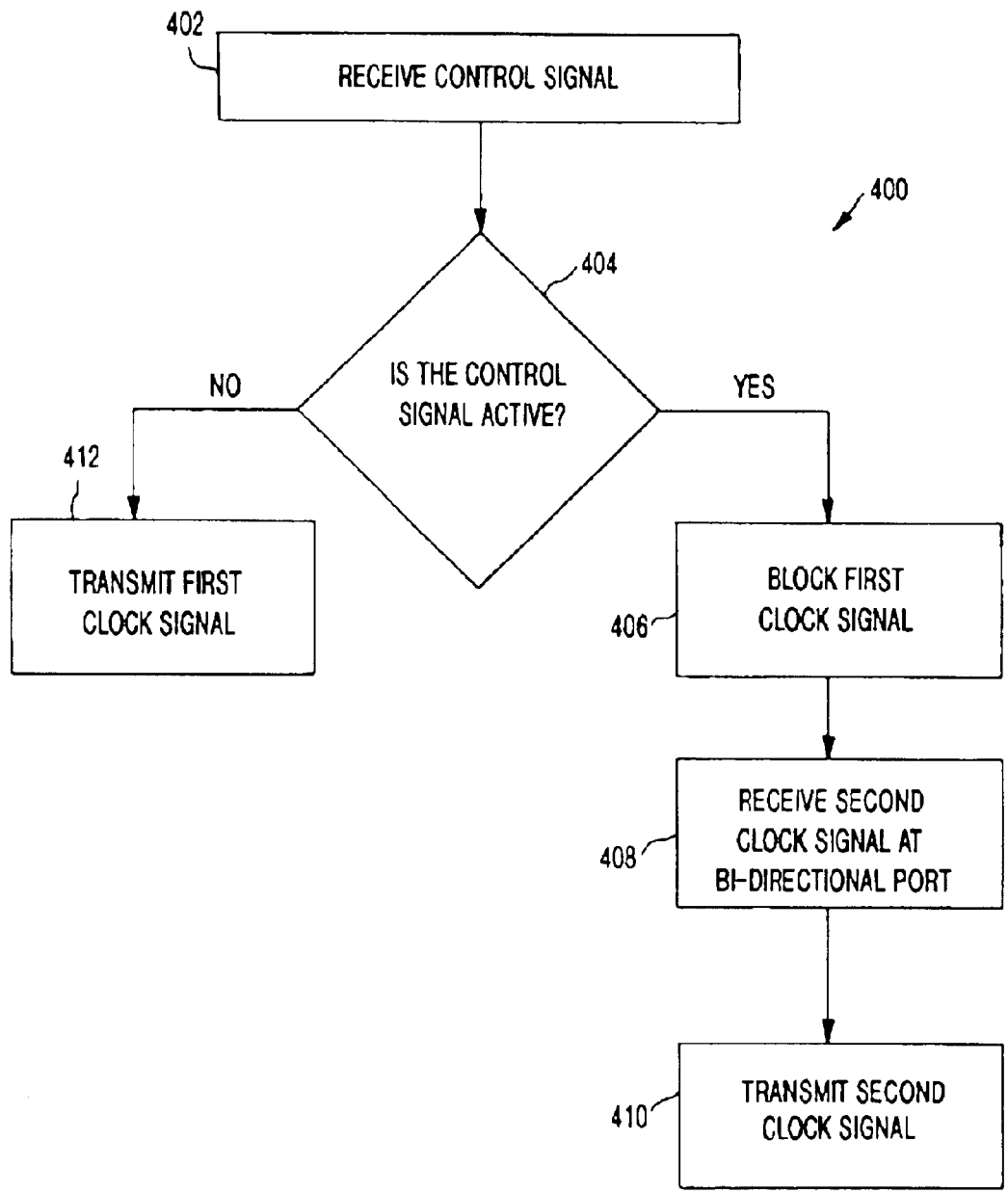
FIG. 4 is a flow chart diagram of a method according to another embodiment of the present invention.

FIG. 4 is a flow chart of an embodiment of another test method 400 according to the teachings of the present invention. Test method 400 includes receiving a control signal at a circuit at block 402. In one embodiment, the control signal is received at a circuit, such as circuit 200, from a scan-tester, such as scan-tester 204. The control signal is evaluated at decision block 404. If the control signal is active, a first clock signal received at the circuit is blocked in block 406. In one embodiment, the active control signal instructs an output buffer, such as output buffer 218, to block the divided-clock signal from a frequency divider, such as frequency divider 208. A second clock signal is received at a bi-directional port of the circuit at block 408 and is transmitted at block 410. In one embodiment, the second clock signal is received at a bi-directional port, such as bi-directional port 216, from a divide/test clock, such as divide/test clock 214. The second clock signal is transmitted to internal logic and flip-flops of an ASIC through an input buffer to test the ASIC for faults, e.g., stuck flip-flops. If the control signal is inactive, the first clock signal is transmitted at block 412. In one embodiment, the first clock signal is a divided-clock signal that flows through an output buffer, into an input buffer, and to internal logic and flip-flops of an ASIC.

CONCLUSION

Embodiments of the present invention have been described. The embodiments eliminate skewing between functional clocks and internally generated divide-down clocks used in existing scan insertion ASIC testing by providing, in various embodiments, circuits and methods that eliminate the use of internally generated divide-down clocks for scan testing. Embodiments of the present invention replace internally generated divide-down clocks with external test clocks that are connected to a bi-directional port and that are independent of any functional clocks.

Although specific embodiments have been illustrated and described in this specification, it will be appreciated by those of ordinary skill in the art that any arrangement that is calculated to achieve the same purpose may be substituted for the specific embodiment shown.

What is claimed is:

1. A circuit comprising:
a first input port connectable to a first external clock;
a second input port connectable to a tester and adapted to receive control signals to selectively block and unblock the first input port;
a bi-directional port connectable to a second external clock; and
an output port;
wherein when the first input port is blocked, the second clock transmits a second clock signal to the output port and when the first input port is unblocked, the first clock transmits a first clock signal to the output port.

2. The circuit of claim 1, wherein the first clock is part of an application specific integrated circuit.

3. The circuit of claim 1, wherein the second clock is part of an application specific integrated circuit.

4. The circuit of claim 1, wherein the output port is connectable to internal logic of an application specific integrated circuit.

5. The circuit of claim 1, and further comprising a first buffer having a first input connected to the first clock via the first input port and a second input connected to the tester via the second input port, and having an output connected to the bi-directional port.

6. The circuit of claim 5, wherein the first buffer is a tri-state output buffer.

7. The circuit of claim 5, and further comprising a second buffer having an input connected to the bi-directional port and to the output of the first buffer, and having an output connected to the output port.

8. The circuit of claim 7, wherein the second buffer is an input buffer.

9. A circuit comprising:
a first buffer having an input port connected to a first external clock, another input port connected to a tester, and an output port;
a bi-directional port connected to the output port of the first buffer and to a second external clock; and
a second buffer having an input port connected to the bi-directional port and to the output port of the first buffer and an output port connectable to external circuitry.

10. The circuit of claim 9, wherein the first clock is part of an application specific integrated circuit.

11. The circuit of claim 9, wherein the second clock is part of an application specific integrated circuit.

12. The circuit of claim 9, wherein the external circuitry comprises logic of an application specific integrated circuit.

13. The circuit of claim 9, wherein the first buffer is a tri-state output buffer.

14. The circuit of claim 9, wherein the second buffer is an input buffer.

15. A circuit comprising:
a first buffer to receive a first clock signal and a control signal, the control signal to selectively pass or block the first control signal; and
a second buffer to receive and pass the first clock signal when the first clock signal is passed or to receive a second independent clock signal through a bi-directional port when the first clock signal is blocked.

16. The circuit of claim 15, wherein the second buffer transmits the first and second clock signals to internal logic of an application specific circuit.

17. The circuit of claim 15, wherein the first clock signal is received from an application specific integrated circuit.

18. The circuit of claim 15, wherein the second clock signal is received from an application specific integrated circuit.

19. The circuit of claim 15, wherein the first buffer is a tri-state output buffer.

20. The circuit of claim 15, wherein the second buffer is an input buffer.

21. A circuit comprising:
a tri-state output buffer having an input port connected to a clock of an application specific integrated circuit, another input port connected to a tester, and an output port;

a second clock connected to the output port of the tri-state output buffer via a bi-directional port; and
an input buffer having an input port connected to the bi-directional port and to the output port of the tri-state output buffer and an output port connected to logic of the application specific integrated circuit.

22. The circuit of claim 21, wherein the clock of the application specific integrated circuit is independent from the second clock.

23. A test method comprising:
receiving a control signal indicative of an active or an inactive test mode of a circuit;
coupling a first external clock through the circuit through a first buffer when the test mode is inactive; and
coupling a second external clock through the circuit through a bi-directional port and a second buffer when the test mode is active.

24. The test method of claim 23, wherein coupling the first external clock comprises coupling a functional clock.

25. The test method of claim 23, wherein coupling the second external clock comprises coupling a divide/test clock.

26. A test method comprising:
receiving a control signal at a circuit;
selectively blocking a first clock signal received at the circuit based on the control signal;
receiving a second clock signal at a bi-directional port of the circuit;
transmitting the second clock signal when the first clock signal is blocked; and
transmitting the first clock signal when the first clock signal is not blocked.

27. The test method of claim 26, wherein receiving the control signal comprises receiving the control signal at a buffer.

28. The test method of claim 26, wherein receiving the control signal comprises receiving the control signal at a tri-state output buffer.

29. The test method of claim 27, wherein blocking the first clock signal comprises blocking the first clock signal at the buffer.

30. The test method of claim 26, and further comprising receiving the second clock signal at a buffer from the bi-directional port before transmitting the second clock signal.

31. The test method of claim 26, and further comprising receiving the second clock signal at an input buffer from the bi-directional port before transmitting the second clock signal.

32. The test method of claim 26, wherein receiving the control signal comprises receiving the control signal from a tester.

33. The test method of claim 26, wherein transmitting the first clock signal comprises transmitting the first clock signal to external logic devices.

34. The test method of claim 26, wherein transmitting the second clock signal comprises transmitting the second clock signal to external logic devices.

35. A test method comprising:
receiving a control signal at a first buffer;
blocking a first clock signal received at the first buffer at the first buffer based on the control signal;
receiving a second clock signal at a second buffer from a bi-directional port; and transmitting the second clock signal from the second buffer to logic devices.

36. The test method of claim 35, wherein receiving the control signal comprises receiving the control signal from a tester.

37. The test method of claim 35, and further comprising receiving another control signal at the first buffer that unblocks the first clock signal.

38. The test method of claim 37, and further comprising transmitting the first clock signal to the logic devices via the first and second buffers.

39. A test method comprising:
coupling a first external clock to a first input port of a first buffer;
coupling a tester to a second input port of the first buffer;
coupling an output port of the first buffer to a bi-directional port and to an input port of a second buffer;
coupling a second external clock to the bi-directional port;
coupling an output port of the second buffer to internal logic devices;
transmitting a control signal from the tester to the first buffer to block a first clock signal transmitted to the first buffer from the first clock; and
transmitting a second clock signal from the second clock to the internal logic devices via the bi-directional port and the second buffer.

40. The test method of claim 39, and further comprising receiving another control signal at the first buffer that unblocks the first clock signal.

41. The test method of claim 40, and further comprising transmitting the first clock signal to the internal logic devices via the first and second buffers.

* * * * *